under 35 U.S.C. 154(b) by 192 days.

(12) United States Patent
Yudhistira et al.

(10) Patent No.: US 7,622,403 B2
(45) Date of Patent: Nov. 24, 2009

(54) SEMICONDUCTOR PROCESSING SYSTEM WITH ULTRA LOW-K DIELECTRIC

(75) Inventors: Yasri Yudhistira, Singapore (SG); Johnny Widodo, Singapore (SG); Bei Chao Zhang, Singapore (SG); Liang-Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 192 days.

(21) Appl. No.: 11/613,155

(22) Filed: Dec. 19, 2006

(65) Prior Publication Data

US 2008/0145795 A1 Jun. 19, 2008

(51) Int. Cl.
*H01L 21/00* (2006.01)
(52) U.S. Cl. ............... 438/795; 438/780; 257/E21.077
(58) Field of Classification Search .............. 438/780, 438/781, 795
See application file for complete search history.

(56) References Cited

U.S. PATENT DOCUMENTS 6,387,824 B1* 5/2002 Aoi ........................... 438/778
6,903,004 B1 6/2005 Spencer et al.
6,992,003 B2 1/2006 Spencer et al.
7,056,840 B2* 6/2006 Miller et al. ................ 438/781
2004/0213986 A1* 10/2004 Kim et al. ................ 428/315.7
2005/0272237 A1 12/2005 Hautala et al.
2005/0272265 A1 12/2005 Geffken et al.

OTHER PUBLICATIONS

Jeffrey M. Catchmark, Guy P. Lavallee, Michael Rogosky, and Youngchul Lee, "Direct Sub-100-nm Patterning of an Organic Low-k Dielectric for Electrical and Optical Interconnects," Journal of Electronic Materials, vol. 34, No. 3, 2005.

* cited by examiner

*Primary Examiner*—Phat X Cao
*Assistant Examiner*—Nga Doan
(74) *Attorney, Agent, or Firm*—Mikio Ishimaru

(57) ABSTRACT

A semiconductor processing system with ultra low-K dielectric is provided including providing a substrate having an electronic circuit, forming an ultra low-K dielectric layer, having porogens, over the substrate, blocking an incoming radiation from a first region of the ultra low-K dielectric layer, evaporating the porogens from a second region of the ultra low-K dielectric layer by projecting the incoming radiation on the second region, and removing the ultra low-K dielectric layer in the first region with a developer.

10 Claims, 5 Drawing Sheets

SEMICONDUCTOR PROCESSING SYSTEM WITH ULTRA LOW-K DIELECTRIC

TECHNICAL FIELD

The present invention relates generally to integrated circuit fabrication systems, and more particularly to a system for managing the application of ultra low-K dielectric material in a semiconductor manufacturing process.

BACKGROUND ART

Porous Generator (Porogens) are pore-forming agents used to add porosity to dielectric materials. Subsequent removal of porogens creates a void space thereby reducing the overall dielectric constant of a film. In a conventional semiconductor device manufacturing process for patterning an ultra low-K dielectric or the like, an ultra low-K layer with porogens incorporated therein is first deposited on a substrate. This is followed by a UV cure process to remove substantially all of the porogens from the preliminary layer thus providing a porous dielectric layer with pores.

A photoresist pattern is subsequently formed on the porous a dielectric layer by exposure to a coherent optical light source or an E-beam through a reticle. The dielectric layer whose portion is not covered by the pattern is etched using the photoresist pattern as a mask to form a conductive layer pattern. The photoresist is removed leaving recesses in the dielectric layer where the conductive material is to be deposited. The conductive material is deposited over the surface and subjected to a chemical-mechanical polishing (CMP) process to isolate and define the conductive pattern. This process is repeated for additional layers.

The photoresist pattern is used as the mask and it should be removed from the dielectric layer with a photoresist remover in a strip process after the process for forming the conductive layer pattern is completed. However, it is difficult to remove photoresist material in the subsequent strip process since the etching process for forming a conductive layer pattern is performed with a dry etching process when making highly integrated devices and, as a result, the physical property of photoresist is deteriorated during the dry etching process.

Dry etching processes have replaced wet etching processes which use liquid acid compositions. In dry etching, gas-solid phase reactions are generated between a plasma etching gas and a targeted layer. Since sharp patterns are obtained with dry etching processes and they are easy to control, dry etching processes are preferred to wet etching processes.

After the photoresist pattern has gone through the dry etch process for forming openings in the dielectric layer, it has to be removed by O2 plasma. This photo resist strip will cause the surface of the low k to be modified. The modification will cause the k value to increase causing the RC delay to be degraded. The modification is basically caused by dissociation of C from the Si network in the low-k that was replaced with either H2O or Silanol.

A known approach of addressing the problem is to directly pattern the ULK layer using e-beam curing. This eliminates the need for a photoresist layer. However, the high dosage used for e-beam curing can cause device damage. Furthermore, the low throughput of e-beam curing is also undesirable.

Thus, a need still remains for a semiconductor system that will effectively remove all photoresist residue, without damaging the underlying dielectric layers, and aid in the further processing of the semiconductor wafer. In view of the ever increasing demand for higher volume and lower cost of integrated circuits, it is increasingly critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides a semiconductor processing system with ultra low-K dielectric including providing a substrate having an electronic circuit, forming an ultra low-K dielectric layer, having porogens, over the substrate, blocking an incoming radiation from a first region of the ultra low-K dielectric layer, evaporating the porogens from a second region of the ultra low-K dielectric layer by projecting the incoming radiation on the second region, and removing the ultra low-K dielectric layer in the first region with a developer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
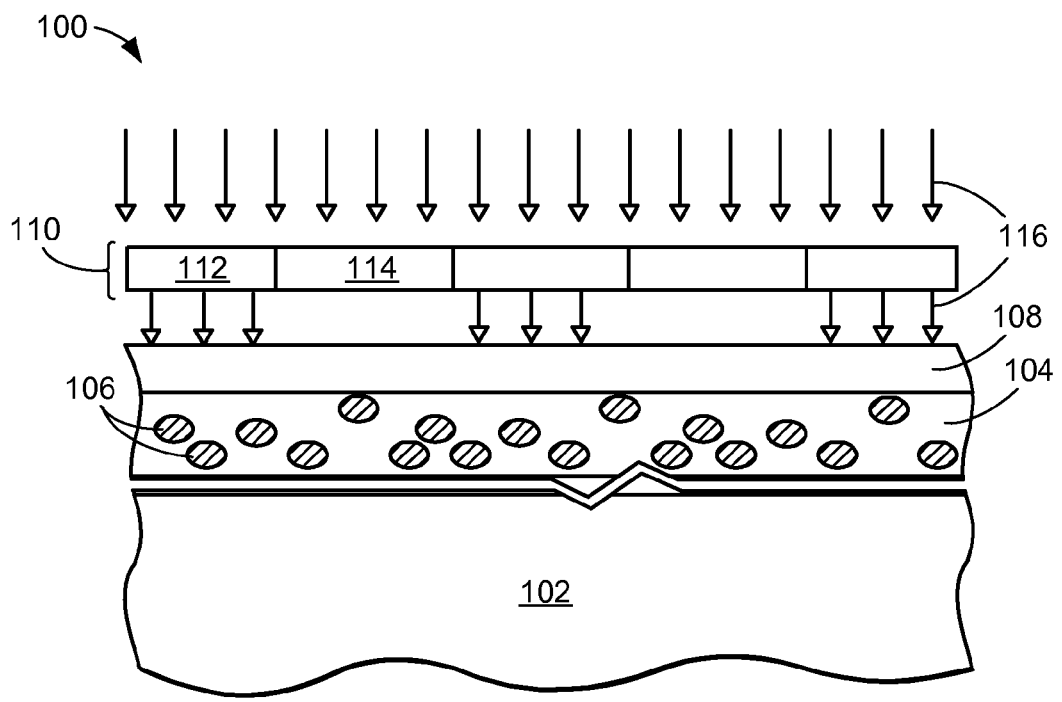
FIG. 1 is a partial cross-sectional view of a semiconductor processing system with ultra low-K dielectric, in a photoresist patterning phase, in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGs. Also, where multiple embodiments are disclosed and described having some features in common, for clarity and ease of illustration, description, and comprehension thereof, similar and like features, one to another, will ordinarily be described with like reference numerals.

The term "horizontal" as used herein is defined as a plane parallel to the conventional plane or surface of the semiconductor substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes deposition of material or photoresist, patterning, exposure, development, etching, cleaning, and/or removal of the material or photoresist as required in forming a described structure.

Referring now to FIG. 1, therein is shown a partial cross-sectional view of a semiconductor processing system 100 with ultra low-K dielectric, in a photoresist patterning phase, in an embodiment of the present invention. The partial cross-sectional view depicts a substrate 102, having an electronic circuit fabricated thereon (not shown), an ultra low-K dielectric layer 104 is deposited over the substrate 102. The ultra low-K dielectric layer 104 has porogens 106, such as a sacrificial polymer, disbursed throughout the ultra low-K dielectric layer 104. A photoresist layer 108 is applied on the ultra low-K dielectric layer 104.

The ultra-low dielectric layers are of the type consisting both matrix precursors and porogen. They may have ultra-low dielectric constants below 2.5 and are of such materials as polytetrafluoroethylene (PTFE) commercially available as Teflon-AF and Teflon microemulsion, polyimide nanofoams such as polypropylene oxide, silica aerogels, silica xerogels, and mesoporous silica. Besides the spin on dielectric examples mentioned above, PECVD ULK based, for example DEMS, DMDMOS, VDEMS, etc as the matrix precursors with ATRP, BCHD, etc as the porogen (Porous Generator) may be used as well.

A reticle 110, having a translucent section 112 and an opaque section 114, is mounted in a photoresist patterning system (not shown). An incoming radiation 116, such as a partially coherent light or an ultraviolet light, illuminates the reticle and passes through only the translucent section 112. The image of the reticle 110 is projected on the photoresist layer 108. The area of the photoresist layer 108 that is under the translucent section 112 is chemically altered by the incoming radiation 116 and becomes soluble to a developer (not shown). For reasons which will be evident in the succeeding paragraphs, the photoresist layer 108 comprises a material which is insensitive to the range of uv wavelength used for curing the ultra low-K dielectric 104. Also, the photoresist layer 108 has to prevent the covered portions of the dielectric layer from being cured.

Figure 2:
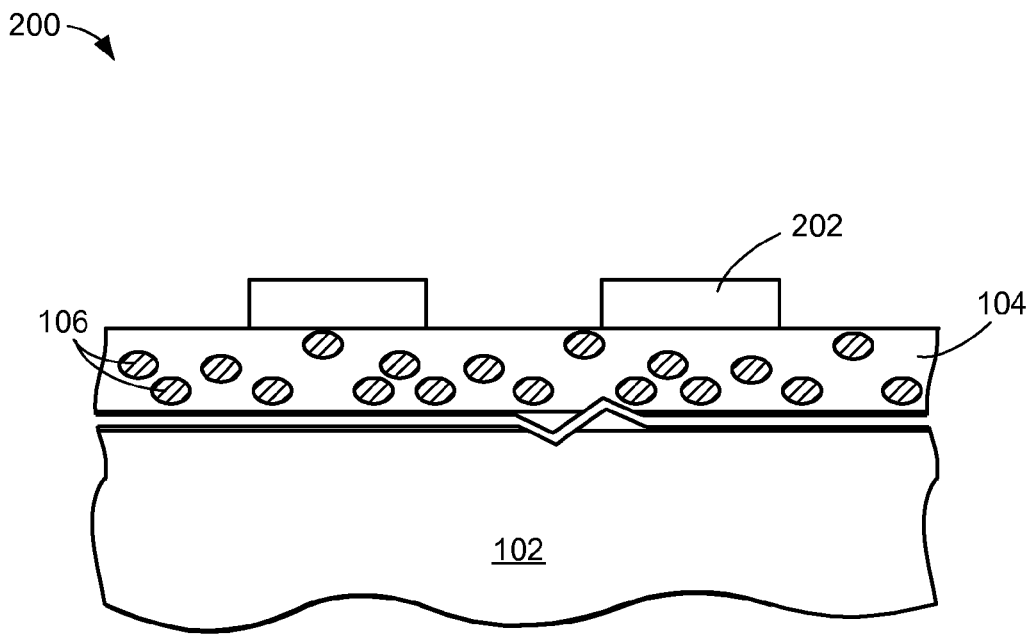
FIG. 2 is a partial cross-sectional view of a semiconductor processed substrate with ultra low-K dielectric with porogens, in a photoresist masking phase.

Referring now to FIG. 2, therein is shown a partial cross-sectional view of a semiconductor processed substrate 200 with ultra low-K dielectric, in a photoresist masking phase. The partial cross-sectional view of the semiconductor processed substrate 200 includes the substrate 102, the ultra low-K dielectric layer 104, and the porogens 106 disbursed throughout the ultra low-K dielectric layer 104. A photoresist mask 202 remains on the ultra low-K dielectric layer 104.

The photoresist mask 202 was patterned when the photoresist layer 108, of FIG. 1, was chemically altered by exposure to the incoming radiation 116, of FIG. 1. A photoresist developer (not shown) was used to remove the portions of the photoresist layer 108 that were chemically altered. The remaining portions of the photoresist layer 108 stay firmly adhered on the ultra low-K dielectric layer 104 as the photoresist mask 202.

Figure 3:
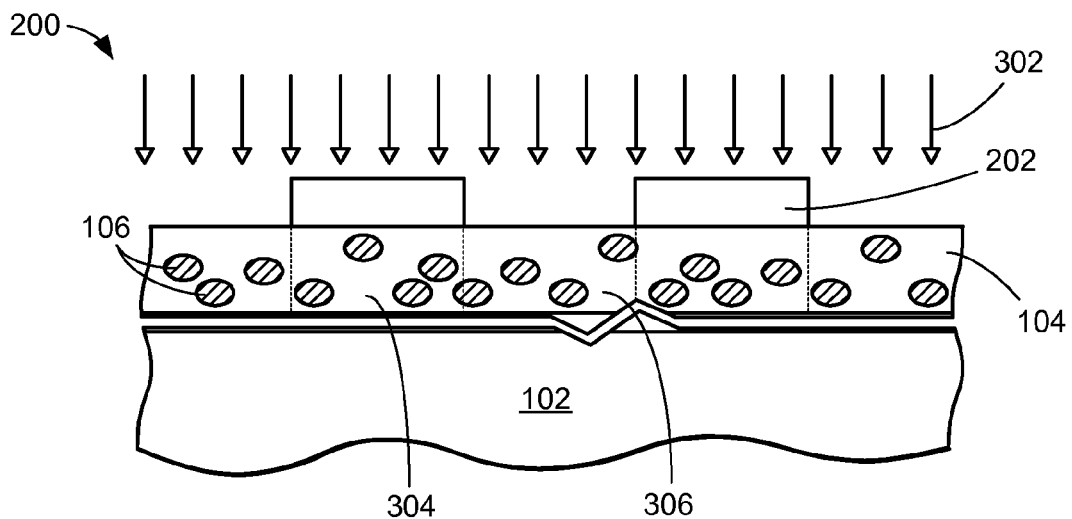
FIG. 3 is a partial cross-sectional view of the semiconductor processed substrate with ultra low-K dielectric, in a ULK curing phase.

Referring now to FIG. 3, therein is shown a partial cross-sectional view of the semiconductor processed substrate 200 with ultra low-K dielectric, in a ULK layer curing phase. The partial cross-sectional view of the semiconductor processed substrate 200 depicts the substrate 102, the ultra low-K dielectric layer 104, and the porogens 106 disbursed throughout the ultra low-K dielectric layer 104.

The photoresist mask 202 remains on the ultra low-K dielectric layer 104. A first incoming radiation 302, such as an ultraviolet light applied in a coherent fashion, is completely blocked from area first region 304 of the ultra low-K dielectric layer 104 that is covered by the photoresist mask 202. A second region 306 of the ultra low-K dielectric layer 104 that is exposed to the first incoming radiation 302 is chemically altered. Specifically the porogens 106 embedded in the exposed regions of the ultra low-K dielectric layer 104 are substantially removed, causing the exposed regions to become porous.

When the ultra low-K dielectric layer 104 is cured to form pores, the porogen removal process may liberate all the porogens 106 exposed to the first incoming radiation 302 or just fragments thereof. A part of the porogens 106 may remain attached to the ultra low-K dielectric layer 104 for reasons such as to impart hydrophobicity. Either option is applicable to the present invention. In a preferred embodiment, the porogens 106 are all liberated as this provides better selectivity to form geometric structures.

Figure 4:
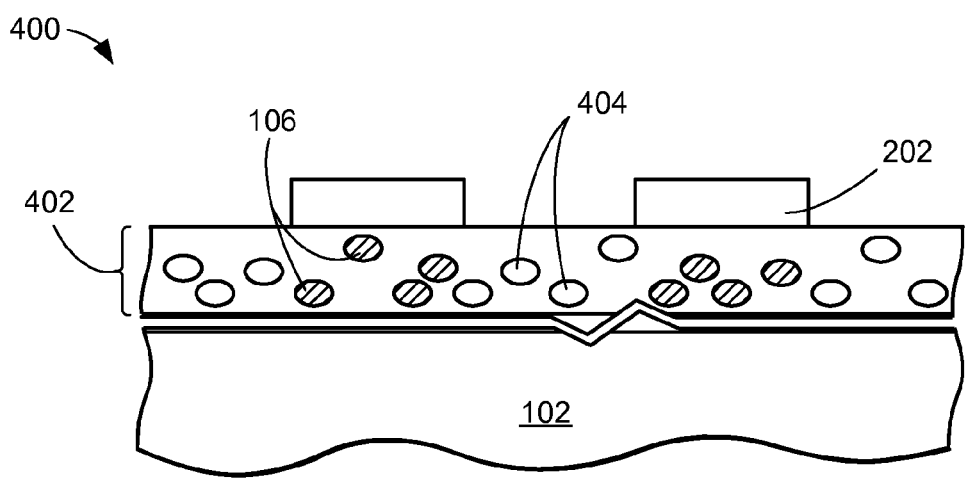
FIG. 4 is a partial cross-sectional view of the semiconductor processed substrate with ultra low-K dielectric, after the porogen in exposed regions of the ultra low-K dielectric have been removed.

Referring now to FIG. 4, therein is shown a partial cross-sectional view of a semiconductor processed substrate 400 with ultra low-K dielectric after a UV cure process. The partial cross-sectional view of the semiconductor processed substrate 400 includes a patterned ULK layer 402, having nanopores 404, the porogens 106, and the photoresist mask 202. The nanopores 404 are created in the locations where the porogens 106 that have evaporated used to reside.

The uv cure temperature has to be kept sufficiently low in order to prevent photoresist mask 202 flow which can make it difficult to remove the photoresist mask 202 without resorting to a plasma ash, hence defeating the object of the present invention. In one embodiment, the UV cure temperature is not more than 250° C. and preferably less than 200° C. While the remaining process conditions, those conventional in the art are suitable, for example, single wavelength or broadband uv with wavelength 200-400 nm having a power of 0 to 5000 W.

The porogens 106 that were shielded by the photoresist mask 202 are not subject to evaporation. The photoresist mask 202 prevented that cross-linking of the matrix of the porogens 106 that was shielded.

Figure 5:
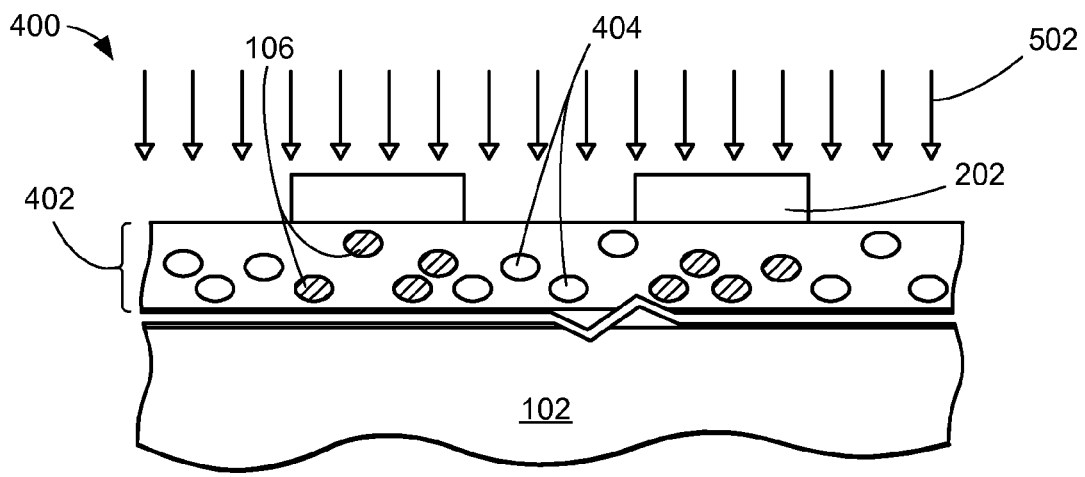
FIG. 5 is a partial cross-sectional view of the semiconductor processed substrate with ultra low-K dielectric, in a photoresist softening phase.

Referring now to FIG. 5, therein is shown a partial cross-sectional view of the semiconductor processed substrate 400 with ultra low-K dielectric, in a photoresist softening phase. The partial cross-sectional view of the semiconductor processed substrate 400 depicts the patterned ULK layer 402, having the nanopores 404 and the porogens 106, and the photoresist mask 202. A second incoming radiation 502 such as an ultraviolet light is applied, in a coherent or incoherent fashion, to the semiconductor processed substrate 400. This wavelength of the second incoming radiation 502 penetrates the photoresist mask 202 and the portion of the patterned ULK layer 402 that was not evaporated.

The second incoming radiation 502 can be substantially the same as that used to pattern the photoresist mask 202 or alternatively any other wavelength which will enable the photoresist mask 202 to be removed. It need not be of a wavelength which provides good resolution since the photoresist mask 202 is to be totally removed.

Figure 6:
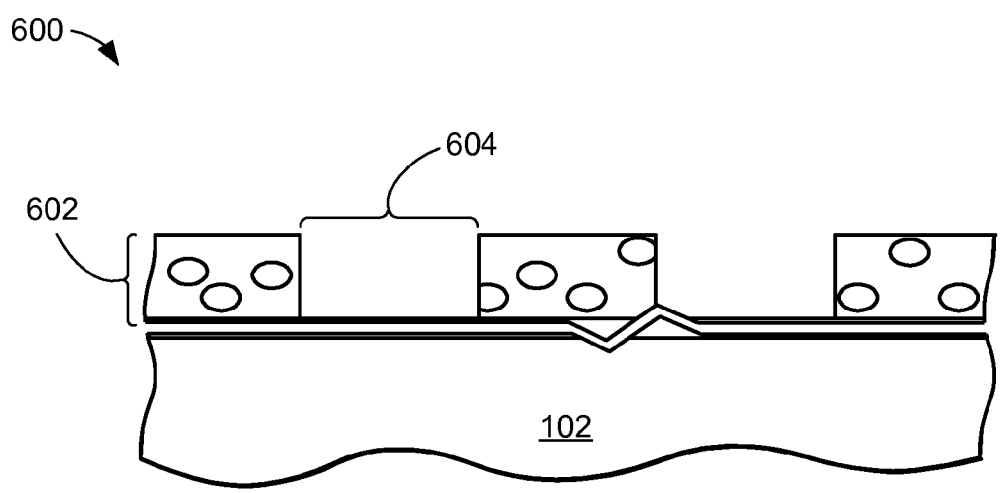
FIG. 6 is a partial cross-sectional view of the semiconductor processed substrate with ultra low-K dielectric, in a photoresist removal phase.

Referring now to FIG. 6, therein is shown a partial cross-sectional view of a semiconductor processed substrate 600 with ultra low-K dielectric, in a photoresist removal phase. The partial cross-sectional view of the semiconductor processed substrate 600 includes a channeled ULK layer 602 and channels 604. The channels 604 are formed by using the aqueous solution of tetra methyl ammonium hydroxide (TMAH) and methanol. The TMAH simultaneously dissolves the photoresist mask 202, of FIG. 2, as well as the areas of the channeled ULK layer 602 that were not evaporated previously. Alternatively, it is also possible to remove the photoresits mask 202 and un-cured ULK using separate developers. The channels 604 are ready to accept a deposition of conductive material (not shown), such as copper or aluminum. The conductive material forms the interconnect structure for the electronic circuit (not shown) fabricated on the substrate 102.

Figure 7:
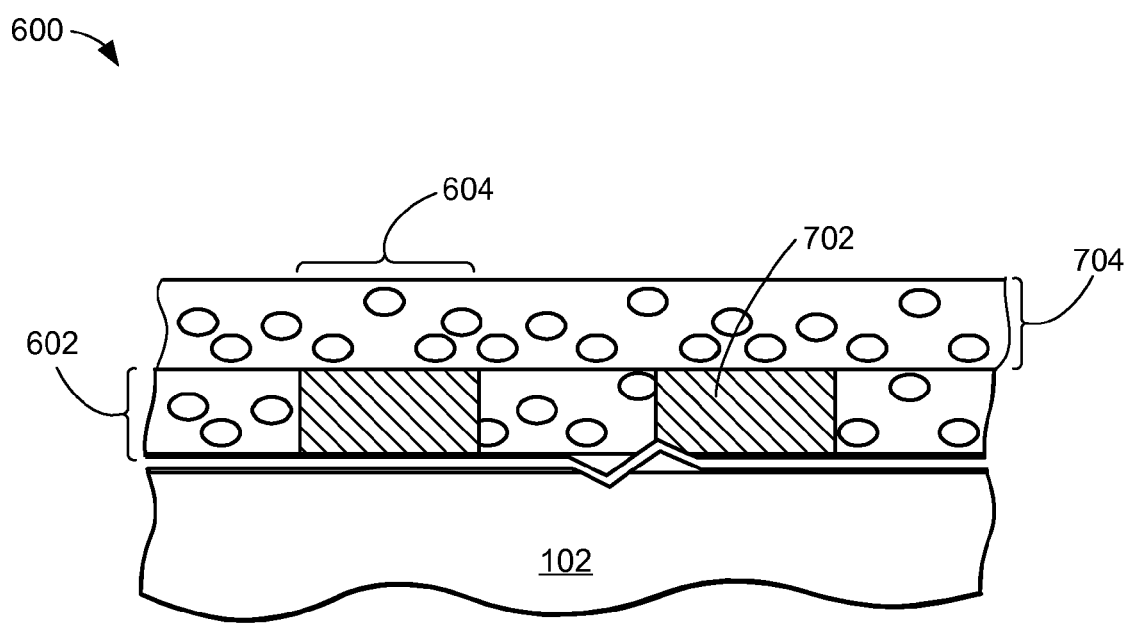
FIG. 7 is a partial cross-sectional view of the semiconductor processed substrate with ultra low-K dielectric, in a conductive material deposition phase.

Referring now to FIG. 7, therein is shown a partial cross-sectional view of the semiconductor processed substrate 600 with ultra low-K dielectric, in a conductive material deposition phase. The partial cross-sectional view of the semiconductor processed substrate 600 includes the channeled ULK layer 602, the channels 604 and a conductive material 702, such as copper, tin, aluminum or a combination thereof. The conductive material 702 is deposited in the channels 604 and is the subjected to a chemical-mechanical polishing (CMP) process. The CMP process creates flat surface such that the conductive material 702 is coplanar with the channeled ULK layer 602.

An insulator 704, such as SiC, SiCN, or SiN, is deposited on the conductive material 702. Each layer of the conductive material 702 that is added to the interconnect structure of the electronic circuit (not shown) is bordered by the insulator 704. The interconnect layers are electrically isolated by forming the insulator 704 on the conductive material 702.

Figure 8:
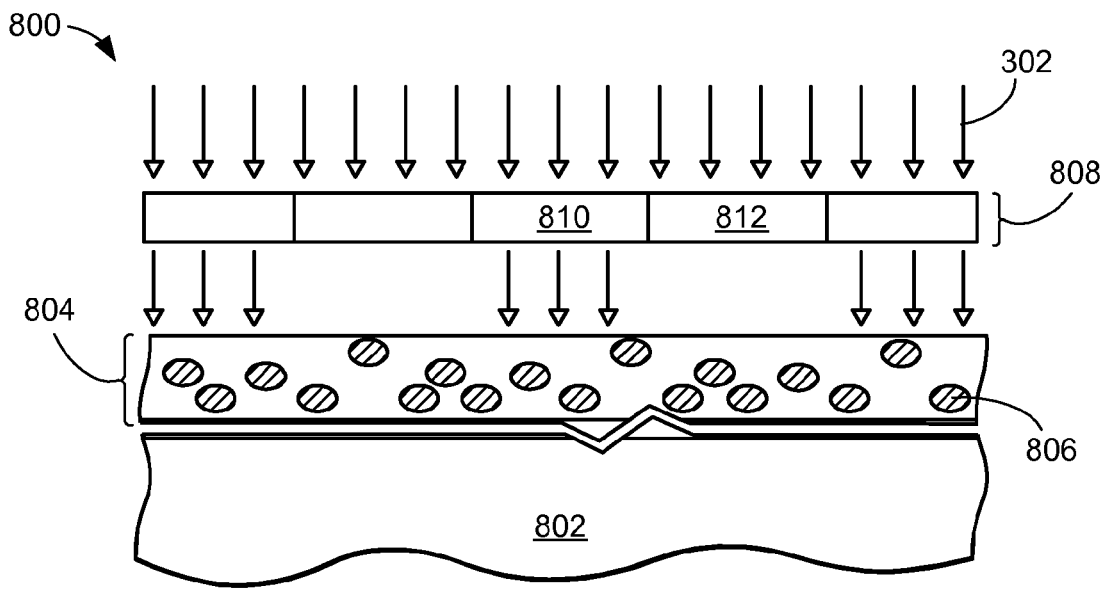
FIG. 8 is a partial cross-sectional view of an alternative semiconductor processing system, in an embodiment of the present invention.

Referring now to FIG. 8, therein is shown a partial cross-sectional view of an alternative semiconductor processing system 800, in an embodiment of the present invention. The partial cross-sectional view of the alternative semiconductor processing system 800 includes a substrate 802, having an electronic circuit fabricated thereon (not shown), an ultra low-K dielectric layer 804 is deposited over the substrate 802. The ultra low-K dielectric layer 804 has porogens 806, such as a sacrificial polymer, disbursed throughout the ultra low-K dielectric layer 804.

A reticle 808, having a translucent section 810 and an opaque section 812, is mounted in a patterning system (not shown). The first incoming radiation 302 illuminates the reticle and passes through only the translucent section 810. The image of the reticle 808 is projected on the ultra low-K dielectric layer 804. The area of the ultra low-K dielectric layer 804 that is under the translucent section 810 is chemically altered by the first incoming radiation 302 and causes the matrix of the porogens 806 to be evaporated. Since this embodiment does not involve the use of the photoresist mask 202 of FIG. 2, the uv cure temperature may be higher. Other process conditions remain the same as before.

Figure 9:
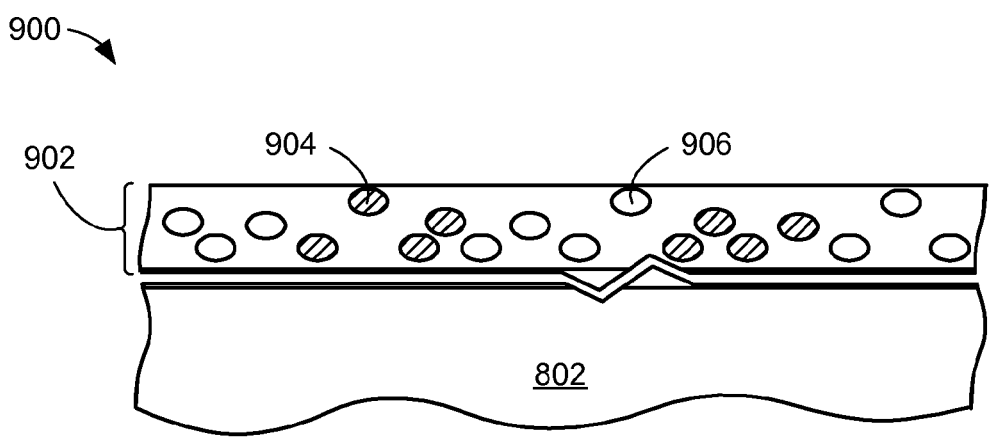
FIG. 9 is a partial cross-sectional view of the alternative semiconductor processed substrate, in a porogens degradation phase.

Referring now to FIG. 9, therein is shown a partial cross-sectional view of an alternative semiconductor processed substrate 900, after the removal of porogens 106 in the dielectric regions exposed to the first incoming radiation 302. The partial cross-sectional view of the alternative semiconductor processed substrate 900 depicts the substrate 802, having a patterned ULK layer 902. The patterned ULK layer 902 contains porogens 904 and nanopores 906.

Figure 10:
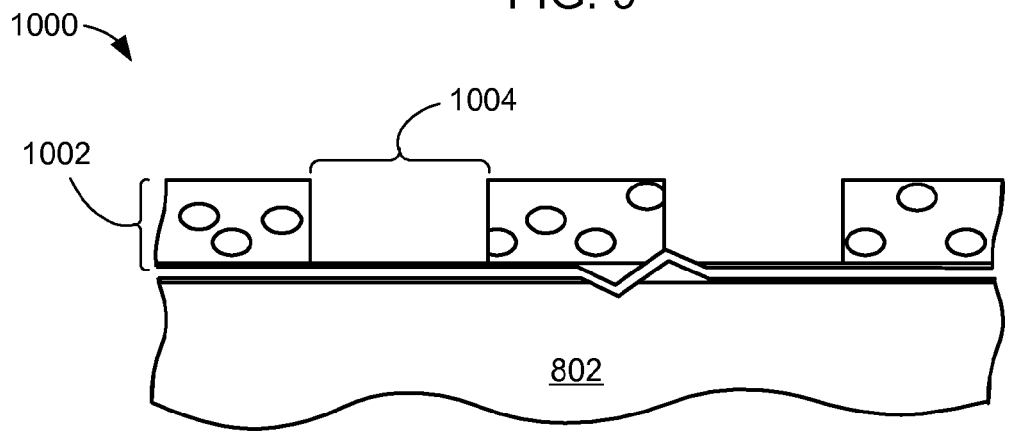
FIG. 10 is a partial cross-sectional view of the alternative semiconductor processed substrate, in a ULK layer developing phase.

Referring now to FIG. 10, therein is shown a partial cross-sectional view of an alternative semiconductor processed substrate 1000, in a ULK layer developing phase. The partial cross-sectional view of the alternative semiconductor processed substrate 1000 includes a channeled ULK layer 1002 and channels 1004. The channels 1004 are formed by using the aqueous solution of tetra methyl ammonium hydroxide (TMAH) and methanol. The areas of the channeled ULK layer 1002 not previously cured by the first incoming radiation 302 are dissolved by the TMAH.

The channels 1004 are ready to accept a deposition of conductive material (not shown), such as copper, tin or aluminum. The conductive material forms the interconnect structure for the electronic circuit (not shown) fabricated on the substrate 802.

Figure 11:
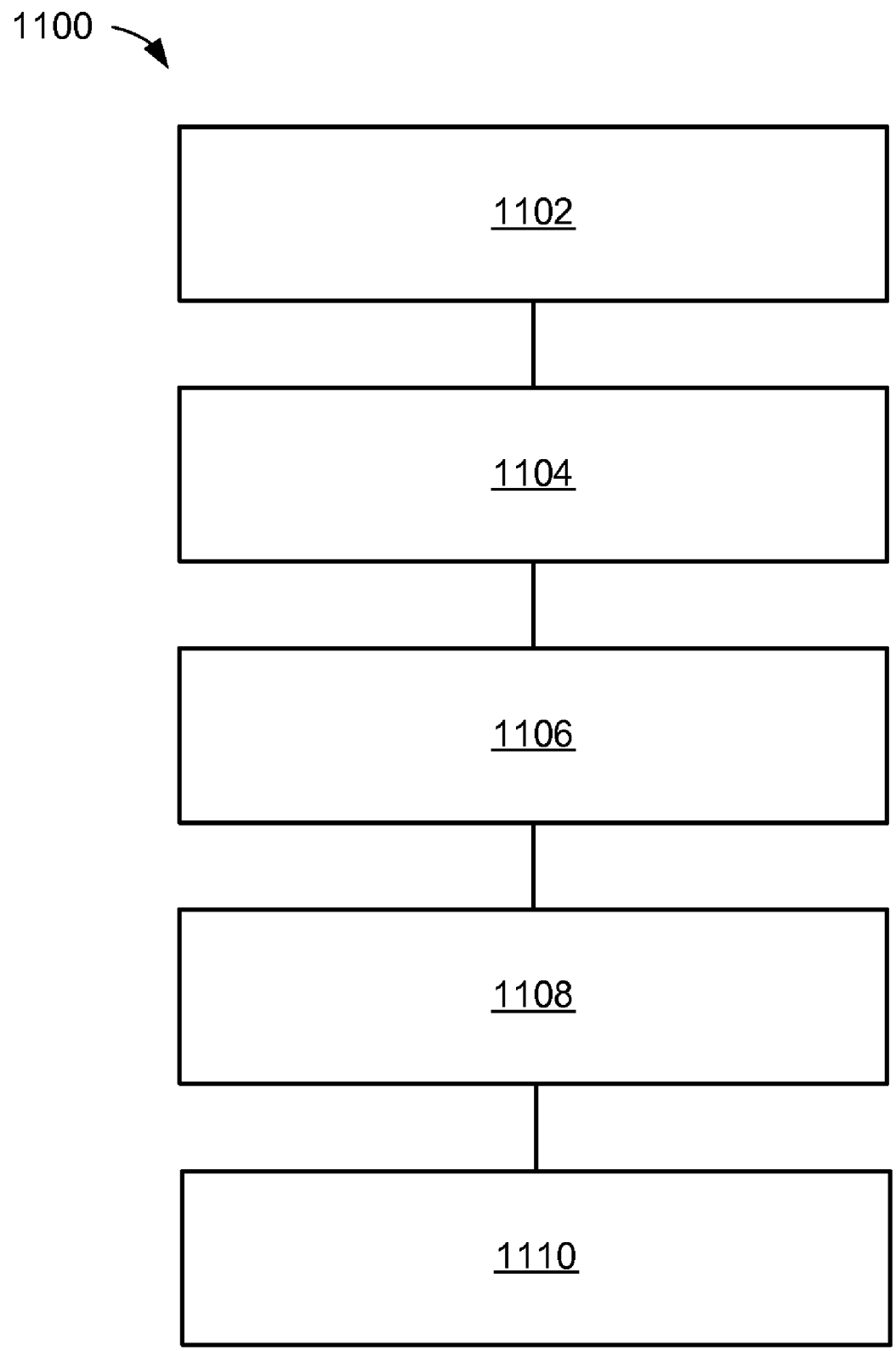
FIG. 11 is a flow chart of a semiconductor processing system for the manufacture of a semiconductor processing system with ultra low-K dielectric, in an embodiment of the present invention.

Referring now to FIG. 11, therein is shown a flow chart of a semiconductor processing system 1100 with ultra low-K dielectric for manufacturing the semiconductor processing system with ultra low-K dielectric layer, in an embodiment of the present invention. The system 1100 includes providing a substrate having an electronic circuit in a block 1102; forming an ultra low-K dielectric layer, having porogens, over the substrate in a block 1104; blocking an incoming radiation from a first region of the ultra low-K dielectric layer in a block 1106; evaporating the porogens from a second region of the ultra low-K dielectric layer by projecting the incoming radiation on the second region in a block 1108; and removing the ultra low-K dielectric layer in the first region with a developer in a block 1110.

In greater detail, a method to manufacture the semiconductor processing system with ultra low-K dielectric in an embodiment of the present invention, is performed as follows:

1. Providing a substrate having an electronic circuit. (FIG. 1)
2. Forming an ultra low-K dielectric layer, having porogens, over the substrate including forming an insulator around a conductive material. (FIG. 1)
3. Projecting an incoming radiation on the ultra low-K dielectric layer to selectively remove porogens from regions of the ultra low-K dielectric layer. A nanopore is created in the location where the removed porogens used to reside. (FIGS. 3 and 4) and
4. Selectively removing regions of the ultra low-K dielectric layer where porogens remain embedded with a developer. (FIG. 6)

It has been discovered that the semiconductor processing system with ultra low-K dielectric layer allows the ultra low-K dielectric material to be used in a manufacturing flow, without damaging the ultra low-K dielectric (ULK) layer. Previously known methods subjected the ULK layer to stress that cracked or deformed it.

It has been discovered that the present invention thus has numerous aspects.

An aspect is that the present invention it provides a manufacturable process to include undamaged ultra low-K dielectric layers in the interconnect layers. The ULK layers allow better isolation between high speed interconnects within the electronic circuit.

Another aspect is the present invention provides a simpler manufacturing flow with fewer steps.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the semiconductor processing system with ultra low-K dielectric method and apparatus of the present invention furnish important and heretofore unknown and unavailable solutions, capabilities, and functional aspects for manufacturing electronic circuits with high speed interconnects and geometries below 100 nm. The resulting processes and configurations are straightforward, cost-effective, uncomplicated, highly versatile and effective, can be implemented by adapting known technologies, and are thus readily suited for efficiently and economically manufacturing integrated circuit devices fully compatible with conventional manufacturing processes and technologies.

The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A semiconductor processing system with ultra low-K dielectric comprising:
   providing a substrate having an electronic circuit;
   forming an ultra low-K dielectric layer, having porogens, over the substrate;
   applying a photoresist layer on the ultra low-K dielectric layer;
   blocking an incoming radiation from a first region of the ultra low-K dielectric layer;
   evaporating the porogens from a second region of the ultra low-K dielectric layer by projecting the incoming radiation on the second region; and
   removing the ultra low-K dielectric layer and the photoresist layer in the first region with a developer.

2. The system as claimed in claim 1 further comprising forming a channel in the ultra low-K dielectric layer by removing the ultra low-K dielectric layer in the first region.

3. The system as claimed in claim 1 further comprising providing a reticle for projecting a pattern on a photoresist layer.

4. The system as claimed in claim 1 further comprising forming a nanopore includes projecting an ultraviolet light on a matrix of the porogens.

5. The system as claimed in claim 1 wherein removing the porogens includes using a developer to etch a path for a conductive material.

6. A semiconductor processing system with ultra low-K dielectric comprising:
   providing a substrate having an electronic circuit;
   forming an ultra low-K dielectric layer, having porogens, over the substrate including forming an insulator on a conductive material;
   applying a photoresist layer on the ultra low-k dielectric layer including patterning a first region;
   blocking an incoming radiation from a first region of the ultra low-K dielectric layer including blocking the incoming radiation using a photoresist mask or a reticle;
   evaporating the porogens from a second region of the ultra low-K dielectric layer by projecting the incoming radiation on the second region to form a nanopore; and
   removing the porogens from the ultra low-K dielectric layer includes selectively removing the first region from the ultra low-K dielectric layer and the photo resist with a developer.

7. The system as claimed in claim 6 further comprising forming a channel in the ultra low-K dielectric layer for depositing the conductive material.

8. The system as claimed in claim 6 further comprising providing a reticle for projecting a pattern on a photoresist layer includes providing a translucent section and an opaque section.

9. The system as claimed in claim 6 wherein forming the nanopore includes:
   illuminating a matrix of the porogens with an ultraviolet light including chemically altering the ultra low-K dielectric layer; and
   evaporating the porogens to evacuate the nanopores.

10. The system as claimed in claim 6 wherein removing the porogens includes using the developer for removing the photoresist mask and the porogens in the first region including forming a path for the conductive material.

* * * * *

UNITED STATES PATENT AND TRADEMARK OFFICE
CERTIFICATE OF CORRECTION

PATENT NO.         : 7,622,403 B2                                              Page 1 of 1
APPLICATION NO.    : 11/613155
DATED              : November 24, 2009
INVENTOR(S)        : Yudhistira et al.

It is certified that error appears in the above-identified patent and that said Letters Patent is hereby corrected as shown below:

Column 8:

line 23, delete "a" and insert therefor --the-- line 31, insert therefor --mask-- line 32, delete therefor "a"

Signed and Sealed this

Twentieth Day of April, 2010

David J. Kappos
*Director of the United States Patent and Trademark Office*